United States Patent
Kozomora et al.

(10) Patent No.: US 10,866,117 B2
(45) Date of Patent: Dec. 15, 2020

(54) MAGNETIC FIELD INFLUENCE DURING ROTATION MOVEMENT OF MAGNETIC TARGET

(71) Applicant: Allegro MicroSystems, LLC, Worcester, MA (US)

(72) Inventors: Nevenka Kozomora, Manchester, NH (US); William Wilkinson, Manchester, NH (US); Braden Blanchette, Wilton, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 140 days.

(21) Appl. No.: 15/909,208

(22) Filed: Mar. 1, 2018

(65) Prior Publication Data
US 2019/0271568 A1   Sep. 5, 2019

(51) Int. Cl.
*G01B 7/00* (2006.01)
*G01D 5/14* (2006.01)
(Continued)

(52) U.S. Cl.
CPC .............. *G01D 5/142* (2013.01); *G01D 5/16* (2013.01); *G01R 15/207* (2013.01);
(Continued)

(58) Field of Classification Search
CPC ........ G01D 5/142; G01D 5/145; G01D 5/147; G01D 5/202; G01D 5/206; G01D 5/225;
(Continued)

(56) References Cited

U.S. PATENT DOCUMENTS 3,195,043 A   7/1965 Burig et al.
3,281,628 A   10/1966 Bauer et al.
(Continued)

FOREIGN PATENT DOCUMENTS

CH   683 469 A5   3/1994
DE   25 18 054    11/1976
(Continued)

OTHER PUBLICATIONS

PCT International Search Report and Written Opinion dated Apr. 26, 2019 for International Application No. PCT/US2019/017012; 15 pages.
(Continued)

*Primary Examiner* — Thang X Le
(74) *Attorney, Agent, or Firm* — Daly, Crowley, Mofford & Durkee, LLP

(57) ABSTRACT

A system for reducing stray field effects comprises a magnetic target producing a changing magnetic field; a first set of magnetic field sensing elements placed in spaced relation to the magnetic target and comprising at least a first magnetic field sensing element and a second magnetic field sensing element, each magnetic field sensing element having an axis of maximum sensitivity; a second set of magnetic field sensing elements placed in spaced relation to the magnetic target and comprising at least a third magnetic field sensing element and a fourth magnetic field sensing element, each magnetic field sensing element having an axis of maximum sensitivity; and wherein the first set of magnetic field sensing elements is positioned closer to a center point of the magnetic field than the second set of magnetic field sensing elements.

22 Claims, 8 Drawing Sheets

(51) Int. Cl.
  *G01D 5/16* (2006.01)
  *G01R 33/09* (2006.01)
  *G01R 15/20* (2006.01)
  *G01R 33/07* (2006.01)
  *G01P 3/487* (2006.01)

(52) U.S. Cl.
  CPC ......... *G01R 33/072* (2013.01); *G01R 33/091* (2013.01); *G01R 33/098* (2013.01); *G01D 5/145* (2013.01); *G01P 3/487* (2013.01)

(58) Field of Classification Search
  CPC .......... G01D 5/2208; G01D 5/12; G01D 5/14; G01D 5/16; G01D 5/2457; G01D 5/2013; G01D 5/2046; G01R 33/0206; G01R 33/06; G01R 33/063; G01R 33/09; G01R 33/093; G01R 33/0052; G01R 33/18
  See application file for complete search history.

(56) References Cited

U.S. PATENT DOCUMENTS

| | | |
|---|---|---|
| 3,607,528 A | 9/1971 | Gassaway |
| 3,661,061 A | 5/1972 | Tokarz |
| 3,728,786 A | 4/1973 | Lucas et al. |
| 4,048,670 A | 9/1977 | Eysermans |
| 4,079,360 A | 3/1978 | Ookubo et al. |
| 4,188,605 A | 2/1980 | Stout |
| 4,204,317 A | 5/1980 | Winn |
| 4,236,832 A | 12/1980 | Komatsu et al. |
| 4,283,643 A | 8/1981 | Levin |
| 4,315,523 A | 2/1982 | Mahawili et al. |
| 4,438,347 A | 3/1984 | Gehring |
| 4,490,674 A | 12/1984 | Ito |
| 4,573,258 A | 3/1986 | Io et al. |
| 4,614,111 A | 9/1986 | Wolff |
| 4,649,796 A | 3/1987 | Schmidt |
| 4,670,715 A | 6/1987 | Fuzzell |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,752,733 A | 6/1988 | Petr et al. |
| 4,758,943 A | 7/1988 | Aström et al. |
| 4,760,285 A | 7/1988 | Nelson |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,823,075 A | 4/1989 | Alley |
| 4,833,406 A | 5/1989 | Foster |
| 4,893,027 A | 1/1990 | Kammerer et al. |
| 4,908,685 A | 3/1990 | Shibasaki et al. |
| 4,910,861 A | 3/1990 | Dohogne |
| 4,935,698 A | 6/1990 | Kawaji et al. |
| 4,970,411 A | 11/1990 | Halg et al. |
| 4,983,916 A | 1/1991 | Iijima et al. |
| 5,012,322 A | 4/1991 | Guillotte et al. |
| 5,021,493 A | 6/1991 | Sandstrom |
| 5,028,868 A | 7/1991 | Murata et al. |
| 5,045,920 A | 9/1991 | Vig et al. |
| 5,078,944 A | 1/1992 | Yoshino |
| 5,084,289 A | 1/1992 | Shin et al. |
| 5,121,289 A | 6/1992 | Gagliardi |
| 5,137,677 A | 8/1992 | Murata |
| 5,139,973 A | 8/1992 | Nagy et al. |
| 5,167,896 A | 12/1992 | Hirota et al. |
| 5,168,244 A | 12/1992 | Muranaka |
| 5,185,919 A | 2/1993 | Hickey |
| 5,196,794 A | 3/1993 | Murata |
| 5,210,493 A | 5/1993 | Schroeder et al. |
| 5,216,405 A | 6/1993 | Schroeder et al. |
| 5,220,207 A | 6/1993 | Kovalcik et al. |
| 5,244,834 A | 9/1993 | Suzuki et al. |
| 5,247,202 A | 9/1993 | Popovic et al. |
| 5,247,278 A | 9/1993 | Pant et al. |
| 5,250,925 A | 10/1993 | Shinkle |
| 5,289,344 A | 2/1994 | Gagnon et al. |
| 5,286,426 A | 3/1994 | Rano, Jr. et al. |
| 5,315,245 A | 5/1994 | Schroeder et al. |
| 5,329,416 A | 7/1994 | Ushiyama et al. |
| 5,331,478 A | 7/1994 | Aranovsky |
| 5,332,956 A | 7/1994 | Oh |
| 5,332,965 A | 7/1994 | Wolf et al. |
| 5,412,255 A | 5/1995 | Wallrafen |
| 5,414,355 A | 5/1995 | Davidson et al. |
| 5,424,558 A | 6/1995 | Borden et al. |
| 5,434,105 A | 7/1995 | Liou |
| 5,453,727 A | 9/1995 | Shibasaki et al. |
| 5,469,058 A | 11/1995 | Dunnam |
| 5,477,143 A | 12/1995 | Wu |
| 5,479,695 A | 1/1996 | Grader et al. |
| 5,486,759 A | 1/1996 | Seiler et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,521,501 A | 5/1996 | Dettmann et al. |
| 5,545,983 A | 8/1996 | Okeya et al. |
| 5,551,146 A | 9/1996 | Kawabata et al. |
| 5,552,706 A | 9/1996 | Carr |
| 5,572,058 A | 11/1996 | Biard |
| 5,581,170 A | 12/1996 | Mammano et al. |
| 5,581,179 A | 12/1996 | Engel et al. |
| 5,621,319 A | 4/1997 | Bilotti et al. |
| 5,627,315 A | 5/1997 | Figi et al. |
| 5,631,557 A | 5/1997 | Davidson |
| 5,640,090 A | 6/1997 | Furuya et al. |
| 5,691,637 A | 11/1997 | Oswald et al. |
| 5,696,790 A | 12/1997 | Graham et al. |
| 5,712,562 A | 1/1998 | Berg |
| 5,714,102 A | 2/1998 | Highum et al. |
| 5,719,496 A | 2/1998 | Wolf |
| 5,729,128 A | 3/1998 | Bunyer et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,796,249 A | 8/1998 | Andräet et al. |
| 5,818,222 A | 10/1998 | Ramsden |
| 5,818,223 A | 10/1998 | Wolf |
| 5,839,185 A | 11/1998 | Smith et al. |
| 5,841,276 A | 11/1998 | Makino et al. |
| 5,859,387 A | 1/1999 | Gagnon |
| 5,886,070 A | 2/1999 | Honkura et al. |
| 5,883,567 A | 3/1999 | Mullins, Jr. |
| 5,912,556 A | 6/1999 | Frazee et al. |
| 5,963,028 A | 10/1999 | Engel et al. |
| 6,011,770 A | 1/2000 | Tan |
| 6,016,055 A | 1/2000 | Jager et al. |
| 6,043,646 A | 3/2000 | Jansseune |
| 6,100,754 A | 8/2000 | Kim et al. |
| 6,136,250 A | 10/2000 | Brown |
| 6,175,233 B1 | 1/2001 | McCurley et al. |
| 6,180,041 B1 | 1/2001 | Takizawa |
| 6,181,036 B1 | 1/2001 | Kazama et al. |
| 6,184,679 B1 | 2/2001 | Popovic et al. |
| 6,198,373 B1 | 3/2001 | Ogawa et al. |
| 6,242,604 B1 | 6/2001 | Hudlicky et al. |
| 6,242,904 B1 | 6/2001 | Shirai et al. |
| 6,242,905 B1 | 6/2001 | Draxelmayr |
| 6,246,226 B1 * | 6/2001 | Kawase ............ G01P 3/487 324/166 |
| 6,265,865 B1 | 7/2001 | Engel et al. |
| 6,278,269 B1 | 8/2001 | Vig et al. |
| 6,291,989 B1 | 9/2001 | Schroeder |
| 6,297,627 B1 | 10/2001 | Towne et al. |
| 6,297,628 B1 | 10/2001 | Bicking et al. |
| 6,323,642 B1 | 11/2001 | Nishimura et al. |
| 6,339,322 B1 | 1/2002 | Loreck et al. |
| 6,351,506 B1 | 2/2002 | Lewicki |
| 6,356,068 B1 | 3/2002 | Steiner et al. |

(56) References Cited

U.S. PATENT DOCUMENTS

| | | |
|---|---|---|
| 6,392,478 B1 | 5/2002 | Mulder et al. |
| 6,436,748 B1 | 8/2002 | Forbes et al. |
| 6,437,558 B2 | 8/2002 | Li et al. |
| 6,452,381 B1 | 9/2002 | Nakatani et al. |
| 6,492,804 B2 | 12/2002 | Tsuge et al. |
| 6,501,270 B1 | 12/2002 | Opie |
| 6,525,531 B2 | 2/2003 | Forrest et al. |
| 6,528,992 B2 | 3/2003 | Shinjo et al. |
| 6,542,847 B1 | 4/2003 | Lohberg et al. |
| 6,545,332 B2 | 4/2003 | Huang |
| 6,545,457 B2 | 4/2003 | Goto et al. |
| 6,545,462 B2 | 4/2003 | Schott et al. |
| 6,590,804 B1 | 7/2003 | Perner |
| 6,653,968 B1 | 11/2003 | Schneider |
| 6,674,679 B1 | 1/2004 | Perner et al. |
| 6,687,644 B1 | 2/2004 | Zinke et al. |
| 6,692,676 B1 | 2/2004 | Vig et al. |
| 6,768,301 B1 | 7/2004 | Hohe et al. |
| 6,770,163 B1 | 8/2004 | Kuah et al. |
| 6,781,233 B2 | 8/2004 | Zverev et al. |
| 6,781,359 B2 | 8/2004 | Stauth et al. |
| 6,798,193 B2 | 9/2004 | Zimmerman et al. |
| 6,815,944 B2 | 11/2004 | Vig et al. |
| 6,822,443 B1 | 11/2004 | Dogaru |
| 6,853,178 B2 | 2/2005 | Hayat-Dawoodi |
| 6,896,407 B2 | 5/2005 | Nomiyama et al. |
| 6,902,951 B2 | 6/2005 | Goller et al. |
| 6,917,321 B1 | 7/2005 | Haurie et al. |
| 7,023,205 B1 | 4/2006 | Krupp |
| 7,026,808 B2 | 4/2006 | Vig et al. |
| 7,031,170 B2 | 4/2006 | Daeche et al. |
| 7,038,448 B2 | 5/2006 | Schott et al. |
| 7,112,955 B2 | 9/2006 | Buchhold |
| 7,112,957 B2 | 9/2006 | Bicking |
| 7,184,876 B2 | 2/2007 | Tuelings et al. |
| 7,190,784 B2 | 3/2007 | Li |
| 7,193,412 B2 | 3/2007 | Freeman |
| 7,199,579 B2 | 4/2007 | Scheller et al. |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,292,095 B2 | 11/2007 | Burt et al. |
| 7,295,000 B2 | 11/2007 | Werth |
| 7,319,319 B2 | 1/2008 | Jones et al. |
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,355,388 B2 | 4/2008 | Ishio |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,915,886 B2 | 3/2011 | Stolfus et al. |
| 7,923,996 B2 | 4/2011 | Doogue et al. |
| 7,936,144 B2 | 5/2011 | Vig et al. |
| 7,956,604 B2 | 6/2011 | Ausserlechner |
| 7,961,823 B2 | 6/2011 | Kolze et al. |
| 7,990,209 B2 | 8/2011 | Romero |
| 8,030,918 B2 | 10/2011 | Doogue et al. |
| 8,058,870 B2 | 11/2011 | Sterling |
| 8,063,634 B2 | 11/2011 | Sauber et al. |
| 8,080,993 B2 | 12/2011 | Theuss et al. |
| 8,089,276 B2 | 1/2012 | Kentsch |
| 8,106,654 B2 | 1/2012 | Theuss et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,253,210 B2 | 8/2012 | Theuss et al. |
| 8,362,579 B2 | 1/2013 | Theuss et al. |
| 8,542,010 B2 | 9/2013 | Cesaretti et al. |
| 8,577,634 B2 | 11/2013 | Donovan et al. |
| 8,610,430 B2 | 12/2013 | Werth et al. |
| 8,624,588 B2 | 1/2014 | Vig et al. |
| 8,629,539 B2 | 1/2014 | Milano et al. |
| 8,680,846 B2 | 3/2014 | Cesaretti et al. |
| 8,754,640 B2 | 6/2014 | Vig et al. |
| 8,773,124 B2 | 7/2014 | Ausserlechner |
| 8,860,404 B2 | 10/2014 | Dwyer et al. |
| 9,081,041 B2 | 7/2015 | Friedrich et al. |
| 9,116,018 B2 | 8/2015 | Frachon |
| 9,164,156 B2 | 10/2015 | Elian et al. |
| 9,201,122 B2 | 12/2015 | Cesaretti et al. |
| 9,201,123 B2 | 12/2015 | Elian et al. |
| 9,411,025 B2 | 8/2016 | David et al. |
| 9,719,806 B2 | 8/2017 | Foletto et al. |
| 9,720,054 B2 | 8/2017 | Drouin et al. |
| 9,810,519 B2 | 11/2017 | Taylor et al. |
| 9,812,588 B2 | 11/2017 | Vig et al. |
| 9,823,090 B2 | 11/2017 | Foletto et al. |
| 9,823,092 B2 | 11/2017 | David et al. |
| 2001/0009367 A1 | 7/2001 | Seitzer et al. |
| 2002/0027488 A1 | 3/2002 | Hayat-Dawoodi et al. |
| 2003/0001563 A1 | 1/2003 | Turner |
| 2003/0038675 A1 | 2/2003 | Gailus et al. |
| 2003/0062891 A1 | 4/2003 | Slates |
| 2003/0102909 A1 | 6/2003 | Motz |
| 2003/0151406 A1* | 8/2003 | Wan .............. G01R 15/205 324/252 |
| 2003/0173955 A1 | 9/2003 | Uenoyama |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0174164 A1 | 9/2004 | Ao |
| 2004/0184196 A1 | 9/2004 | Jayasekara |
| 2004/0189285 A1 | 9/2004 | Uenoyama |
| 2004/0252563 A1 | 12/2004 | Hokuto et al. |
| 2005/0120782 A1 | 6/2005 | Kishibata et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2006/0028204 A1 | 2/2006 | Oohira |
| 2006/0033487 A1 | 2/2006 | Nagano et al. |
| 2006/0038559 A1 | 2/2006 | Lamb et al. |
| 2006/0068237 A1 | 3/2006 | Murphy et al. |
| 2006/0097715 A1 | 5/2006 | Oohira et al. |
| 2006/0125473 A1 | 6/2006 | Frachon et al. |
| 2006/0181263 A1 | 8/2006 | Doogue et al. |
| 2006/0261801 A1 | 11/2006 | Busch |
| 2007/0110199 A1 | 5/2007 | Momtaz et al. |
| 2007/0285089 A1 | 12/2007 | Ibuki et al. |
| 2007/0290682 A1 | 12/2007 | Oohira et al. |
| 2008/0012558 A1 | 1/2008 | Rossler et al. |
| 2008/0013298 A1 | 1/2008 | Sharma et al. |
| 2008/0116884 A1 | 5/2008 | Rettig |
| 2008/0237818 A1 | 10/2008 | Engel et al. |
| 2009/0001964 A1 | 1/2009 | Strzalkowski |
| 2009/0001965 A1 | 1/2009 | Ausserlechner et al. |
| 2009/0001972 A1 | 1/2009 | Fernandez et al. |
| 2009/0058404 A1 | 3/2009 | Kurumado |
| 2009/0085706 A1 | 4/2009 | Baarman et al. |

(56) References Cited

U.S. PATENT DOCUMENTS

| | | |
|---|---|---|
| 2009/0102467 A1 | 4/2009 | Snell et al. |
| 2009/0140725 A1 | 6/2009 | Ausserlechner |
| 2009/0146647 A1 | 6/2009 | Ausserlechner |
| 2009/0152696 A1 | 6/2009 | Dimasacat et al. |
| 2009/0206827 A1 | 8/2009 | Aimuta et al. |
| 2009/0315543 A1 | 12/2009 | Guo et al. |
| 2010/0045268 A1 | 2/2010 | Kilian |
| 2010/0072988 A1 | 3/2010 | Hammerschmidt et al. |
| 2010/0141249 A1 | 6/2010 | Ararao et al. |
| 2010/0188078 A1 | 7/2010 | Foletto et al. |
| 2010/0201356 A1 | 8/2010 | Koller et al. |
| 2010/0211347 A1 | 8/2010 | Friedrich et al. |
| 2010/0237450 A1 | 9/2010 | Doogue et al. |
| 2011/0031960 A1 | 2/2011 | Hohe et al. |
| 2011/0048102 A1 | 3/2011 | Fernandez et al. |
| 2011/0127998 A1 | 6/2011 | Elian et al. |
| 2011/0175605 A1 | 7/2011 | Kim et al. |
| 2011/0291650 A1 | 12/2011 | Franke et al. |
| 2011/0298448 A1 | 12/2011 | Foletto et al. |
| 2012/0007589 A1 | 1/2012 | Okada |
| 2012/0013333 A1 | 1/2012 | Ararao et al. |
| 2012/0019236 A1 | 1/2012 | Tiernan et al. |
| 2012/0086090 A1 | 4/2012 | Sharma et al. |
| 2012/0200290 A1 | 8/2012 | Ausserlechner |
| 2012/0249133 A1 | 10/2012 | Friedrich |
| 2013/0015845 A1 | 1/2013 | Fox |
| 2013/0057257 A1 | 3/2013 | Friedrich et al. |
| 2013/0113474 A1 | 5/2013 | Elian |
| 2013/0265037 A1 | 10/2013 | Friedrich et al. |
| 2013/0278246 A1 | 10/2013 | Stegerer et al. |
| 2013/0320970 A1 | 12/2013 | Foletto et al. |
| 2014/0175584 A1 | 6/2014 | Foletto et al. |
| 2014/0176126 A1 | 6/2014 | Friedrich et al. |
| 2014/0232379 A1* | 8/2014 | Nazarian .............. G01D 5/147 324/207.21 |
| 2014/0266176 A1 | 9/2014 | Fernandez et al. |
| 2014/0347044 A1 | 11/2014 | Monreal et al. |
| 2015/0008907 A1* | 1/2015 | Janisch .............. G01D 5/2448 324/207.25 |
| 2015/0022186 A1 | 1/2015 | Ausserlechner |
| 2015/0022193 A1 | 1/2015 | Burdette et al. |
| 2015/0022197 A1 | 1/2015 | David et al. |
| 2015/0022198 A1 | 1/2015 | David et al. |
| 2015/0137797 A1 | 5/2015 | Ausserlechner et al. |
| 2015/0293185 A1 | 10/2015 | Kaufmann et al. |
| 2015/0346289 A1 | 12/2015 | Ausserlechner |
| 2015/0377648 A1 | 12/2015 | Sirohiwala et al. |
| 2016/0025820 A1 | 1/2016 | Scheller et al. |
| 2016/0041288 A1* | 2/2016 | Backes .................. G01V 3/08 335/205 |
| 2017/0184635 A1* | 6/2017 | Ugge .................. G01R 15/207 |
| 2017/0271399 A1 | 9/2017 | Lee et al. |
| 2017/0314907 A1 | 11/2017 | Taylor et al. |
| 2017/0356760 A1 | 12/2017 | David et al. |
| 2017/0356761 A1 | 12/2017 | Vig et al. |
| 2018/0284310 A1* | 10/2018 | Kawano .............. G01V 3/081 |
| 2018/0335294 A1* | 11/2018 | Ausserlechner ....... G01D 3/036 |
| 2019/0265071 A1* | 8/2019 | Ruigrok ............... G01D 5/16 |

FOREIGN PATENT DOCUMENTS

| | | |
|---|---|---|
| DE | 40 31 560 A1 | 4/1992 |
| DE | 195 39 458 A1 | 4/1997 |
| DE | 196 34 715 A1 | 3/1998 |
| DE | 196 50 935 A1 | 6/1998 |
| DE | 198 38 433 A1 | 3/1999 |
| DE | 198 518 39 A1 | 11/1999 |
| DE | 199 61 504 A1 | 6/2001 |
| DE | 102 10 184 | 9/2003 |
| DE | 103 14 602 A1 | 10/2004 |
| DE | 10 2006 037 226 A1 | 2/2008 |
| DE | 10 2007 018 238 A1 | 10/2008 |
| DE | 10 2007 041 230 B3 | 4/2009 |
| DE | 10 2010 016 584 A1 | 11/2010 |
| DE | 10 2011 102 483 A1 | 11/2012 |
| EP | 0 289 414 A2 | 11/1988 |
| EP | 0 357 013 A2 | 3/1990 |
| EP | 0 357 013 A3 | 3/1990 |
| EP | 0 361 456 A2 | 4/1990 |
| EP | 0 361 456 A3 | 4/1990 |
| EP | 0 504 583 | 9/1992 |
| EP | 0 629 834 A1 | 12/1994 |
| EP | 0 680 103 A1 | 11/1995 |
| EP | 0 898 180 A2 | 2/1999 |
| EP | 0 944 888 A2 | 9/1999 |
| EP | 1 443 332 A1 | 8/2004 |
| EP | 1 580 560 A1 | 9/2005 |
| EP | 1 637 898 A1 | 3/2006 |
| EP | 1 662 353 A1 | 5/2006 |
| EP | 1 679 524 A1 | 7/2006 |
| EP | 1 850 143 A1 | 10/2007 |
| EP | 2 063 229 | 5/2009 |
| EP | 2 402 719 A1 | 1/2012 |
| EP | 2 466 265 A2 | 6/2012 |
| EP | 2 730 893 A1 | 5/2014 |
| EP | 2 770 303 A1 | 8/2014 |
| FR | 2 748 105 A1 | 10/1997 |
| FR | 2 909 756 A1 | 6/2008 |
| GB | 2276727 A | 10/1994 |
| GB | 2481482 A | 12/2011 |
| JP | 363-084176 A | 4/1988 |
| JP | 363-263782 A | 10/1988 |
| JP | 63-300911 | 12/1988 |
| JP | H02-116753 | 5/1990 |
| JP | H03-29817 | 2/1991 |
| JP | H06-273437 | 9/1994 |
| JP | 08-097486 A | 4/1996 |
| JP | 09-166612 | 6/1997 |
| JP | H10-38988 A | 2/1998 |
| JP | 10-332725 | 12/1998 |
| JP | H10-318784 A | 12/1998 |
| JP | 11-064363 | 3/1999 |
| JP | 11-074142 | 3/1999 |
| JP | 2000-183241 A | 6/2000 |
| JP | 2001-043475 A | 2/2001 |
| JP | 2001-141738 A | 5/2001 |
| JP | 2001-165702 A | 6/2001 |
| JP | 2001-165951 | 6/2001 |
| JP | 2002-117500 A | 4/2002 |
| JP | 2002-149013 A | 5/2002 |
| JP | 2002-357920 A | 12/2002 |
| JP | 2003-177171 | 6/2003 |
| JP | 2004-055932 A | 2/2004 |
| JP | 2004-093381 A | 3/2004 |
| JP | 2004-152688 A | 5/2004 |
| JP | 2004-356338 A | 12/2004 |
| JP | 2004-357858 A | 12/2004 |
| JP | 2005-517928 A | 6/2005 |
| JP | 2005-337866 A | 12/2005 |
| JP | 2005-345302 A | 12/2005 |
| JP | 2006-003096 A | 1/2006 |
| JP | 2007-012582 A | 1/2007 |
| JP | 2007-218799 A | 8/2007 |
| JP | 2008-264569 A | 11/2008 |
| JP | 61-48777 | 5/2017 |
| WO | WO 88/09026 | 11/1988 |
| WO | WO 93/12403 | 6/1993 |
| WO | WO 94/08203 | 4/1994 |
| WO | WO 95/18982 | 7/1995 |
| WO | WO 96/02849 A1 | 2/1996 |
| WO | WO 99/49322 | 9/1999 |
| WO | WO 01/74139 A2 | 10/2001 |
| WO | WO 2003/069358 A2 | 8/2003 |
| WO | WO 2003/069358 A3 | 8/2003 |
| WO | WO 2003/107018 A1 | 12/2003 |
| WO | WO 2004/027436 A1 | 4/2004 |
| WO | WO 2004/072672 A1 | 8/2004 |
| WO | WO 2005/013363 A2 | 2/2005 |
| WO | WO 2006/056829 A1 | 6/2006 |
| WO | WO 2006/083479 A1 | 8/2006 |
| WO | WO 2007/138508 A1 | 12/2007 |
| WO | WO 2008/008140 A2 | 1/2008 |
| WO | WO 2008/008140 A3 | 1/2008 |

(56) References Cited

FOREIGN PATENT DOCUMENTS

| WO | WO 2008/048379 A1 | 4/2008 |
|---|---|---|
| WO | WO 2008/121443 A1 | 10/2008 |
| WO | WO 2008/145662 A1 | 12/2008 |
| WO | WO 2009/108422 A2 | 9/2009 |
| WO | WO 2009/108422 A3 | 9/2009 |
| WO | WO 2010/014309 A1 | 2/2010 |
| WO | WO 2010/065315 | 6/2010 |
| WO | WO 2010/096367 A1 | 8/2010 |
| WO | WO 2011/011479 A1 | 1/2011 |
| WO | WO 2012/148646 A1 | 11/2012 |
| WO | WO 2013/169455 A1 | 11/2013 |

OTHER PUBLICATIONS

Ahn et al.; "A New Toroidal-Meander Type Integrated Inductor With A Multilevel Meander Magnetic Core"; IEEE Transactions on Magnetics; vol. 30, No. 1; Jan. 1994; 7 Pages.

Allegro "Two-Wire True Zero Speed Miniature Differential Peak-Detecting Gear Tooth Sensor;" Data Sheet ATS645LSH; 2004; Allegro MicroSystems, Inc.; 14 Pages.

Allegro "High Precision, Highly Programmable Linear Hall Effect Sensor IC with EEPROM, Output Protocols SENT and PWM, and Advanced Output Linearization Capabilities;" Data Sheet A1341; May 17, 2010; Allegro Microsystems, Inc.; 46 Pages.

Allegro "Single Element, Tooth Detecting Speed Sensor IC;" Data Sheet ATS601LSG; Allegro Microsystems, Inc.; Jan. 2013; 14 Pages.

Allegro "Zero-Speed, Self-Calibrating, Non-Oriented, Hall-Effect Gear-Tooth Sensor"; Data Sheet ATS632LSA; Allegro Microsystems, Inc.; Aug. 3, 2001; 12 Pages.

Allegro Hall-Effect IC Applications Guide, http://www.allegromicro.com/en/Products/Design/an/an27701.pdf; Allegro MicroSystems, Inc.; Copyright 1987, 1997; 36 Pages.

Alllegro "True Zero-Speed Low-Jitter High Accuracy Gear Tooth Sensor;" Data Sheet ATS625LSG; 2005; Allegro MicroSystems, Inc.; 21 Pages.

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; 8 Pages.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; 4 Pages.

Ausserlechner; "Limits of Offset Cancellation by the Principle of Spinning Current Hall Probe;" Proceedings of IEEE Sensors; Oct. 2004; 4 Pages.

Ausserlechner; "The piezo-Hall effect in n-silicon for arbitrary crystal orientation;" Proceedings of IEEE Sensors; vol. 3; Oct. 24, 2004; ISBN: 0-7803-8692-2; 4 Pages.

Bahreyni, et al.; "A Resonant Micromachined Magnetic Field Sensor;" IEEE Sensors Journal; vol. 7, No. 9, Sep. 2007; 9 Pages.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; 12 Pages.

Baschirotto et al.; "Development and Analysis of PCB Vector 2-D Magnetic Field Sensor System for Electronic Compass;" IEEE Sensors Journal vol. 6, No. 2; Apr. 2006; 7 Pages.

Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 Pages.

Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10, 2011; 4 Pages.

Demierre, et al.; "Reference Magnetic Actuator for Self-Calibration of a Very Small Hall Sensor Array;" Sensors and Actuators A97-98; Apr. 2002; 8 Pages.

Dwyer, "Back-Biased Packaging Advances (SE, SG & SH versus SA & SB)," http://www.allegromicro.com/en/Products/Design/packaging_advances/index.asp, Copyright 2008; 5 Pages.

Frick, et al.; "CMOS Microsystem for AC Current Measurement with Galvanic Isolation;" IEEE Sensors Journal; vol. 3, No. 6; Dec. 2003; 9 Pages.

Halg; "Piezo-Hall Coefficients of n-Type Silicon;" Journal of Applied Physics; vol. 64, No. 1; Jul. 1, 1988; 7 Pages.

Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008; 126 Pages.

Hosticka; "CMOS Sensor Systems;" Sensors and Actuators A66; Apr. 1998; 7 Pages.

Infineon Product Brief, TLE 4941plusC, Differential Hall IC for Wheel Speed Sensing; Oct. 2010; www.infineon.com/sensors; 2 pages.

Infineon Technologies; "Differential Two-Wire Hall Effect Sensor IC;" TLE4942 Preliminary Data Sheet; Jun. 2000; 13 Pages.

Johnson et al., "Hybrid Hall Effect Device," Appl. Phys. Lett.; vol. 71, No. 7; Aug. 1997; 3 Pages.

Kanda et al.; "The Piezo-Hall Effect in n-Silicon;" $22^{nd}$ International Conference on the Physics of Semiconductors; vol. 1, Jan. 1995; 4 Pages.

Kapser et al.; "Integrated GMR Based Wheel Speed Sensor for Automotive Applications;" IEEE 2007 Conference on Sensors; Oct. 2007; 4 Pages.

Kammerer et al.; "A Hall effect sensors network insensitive to mechanical stress;" Proceedings of IEEE Sensors; vol. 3; Oct. 2004; 4 Pages.

Lagorce et al.; "Magnetic and Mechanical Properties of Micromachined Strontium Ferrite/Polyimide Composites;" Journal of Microelectromechanical Systems; vol. 6, No. 4; Dec. 1997; 15 Pages.

Lequesne et al.; "High-Accuracy Magnetic Position Encoder Concept;" IEEE Transactions on Industry Applications; vol. 35, No. 3; May/Jun. 1999; 9 Pages.

Magnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; 4 Pages.

Manic et al.; "Short and Long-Term Stability Problems of Hall Plates in Plastic Packages;" IEEE $38^{th}$ Annual International Reliability Physics Symposium; Apr. 2000; 6 Pages.

Manic; "Drift in Silicon Integrated Sensors and Circuits Due to the Thermo-Mechanical Stresses;" Lausanne, École Polytechnique Fédérale De Lausanne 2000; Part 1 of 2; 74 Pages.

Manic; "Drift in Silicon Integrated Sensors and Circuits Due to the Thermo-Mechanical Stresses;" Lausanne, École Polytechnique Fédérale De Lausanne 2000; Part 2 of 2; 102 Pages.

Melexis Microelectronic Systems, Hall Applications Guide, Section 3—Applications;1997; 48 Pages.

Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; 7 Pages.

Motz, et al.; "A Chopped Hall Sensor with Small Jitter and Programmable "True Power-On" Function;" IEEE Journal of Solid-State Circuits; vol. 40, No. 7; Jul. 2005; 8 Pages.

Motz, et al.; "An Integrated Hall Sensor Platform Design for Position, Angle and Current Sensing;" IEEE Sensors 2006; Exco, Daegu, Korea; Oct. 22-25, 2006; 4 Pages.

Munter; "A Low-offset Spinning-current Hall Plate;" Sensors and Actuators A21-A23; 1990; 4 Pages.

Munter; "Electronic Circuitry for a Smart Spinning-current Hall Plate with Low Offset;" Sensors and Actuators A; Jun. 1991; 5 Pages.

Oniku et al., "High-Energy-Density Permanent Micromagnets Formed From Heterogeneous Magnetic Powder Mixtures", Interdisciplinary Microsystems Group, Dept. of Electrical and Computer Engineering, University of Florida, Gainesville, FL 32611, USA; Preprint of MEMS 2012 Conf. Paper; 4 Pages.

(56) References Cited

OTHER PUBLICATIONS

Park et al.;"Batch-Fabricated Microinductors with Electroplated Magnetically Anisotropic and Laminated Alloy Cores"; IEEE Transactions on Magnetics; vol. 35, No. 5; Sep. 1999; 10 Pages.
Park et al.; "Ferrite-Based Integrated Planar Inductors and Transformers Fabricated at Low Temperature;" IEEE Transactions on Magnetics; vol. 33, No. 5; Sep. 1997; 3 Pages.
Partin et al.; "Temperature Stable Hall Effect Sensors;" IEEE Sensors Journal, vol. 6, No. 1; Feb. 2006; 5 Pages.
Pastre, et al.; "A Hall Sensor Analog Front End for Current Measurement with Continuous Gain Calibration;" IEEE Sensors Journal; vol. 7, No. 5; May 2007; 8 Pages.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; 4 Pages.
Popovic; "Sensor Microsystems;" Proc. 20$^{th}$ International Conference on Microelectronics (MWIL 95); vol. 2, NIS, Serbia, 12-14; Sep. 1995; 7 Pages.
Randhawa; "Monolithic Integrated Hall Devices in Silicon Circuits;" Microelectronics Journal; vol. 12, No. 6; Sep. 14-17, 1981; 6 Pages.
Robert Bosch GMBH Stuttgart; "Active Sensor for ABS/ASR/VDC-Systems with 2-Wire-Current Interface;" Specification TLE4941/TLE4942; Version 5; Jun. 25, 2000; 44 Pages.
Ruther et al.; "Integrated CMOS-Based Sensor Array for Mechanical Stress Mapping;" 5$^{th}$ IEEE Conference on Sensors, Oct. 2007; 4 Pages.
Ruther et al.; "Thermomagnetic Residual Offset in Integrated Hall Plates;" IEEE Sensors Journal; vol. 3, No. 6; Dec. 2003; 7 Pages.
Sargent; "Switched-capacitor IC controls feedback loop;" EDN; Design Ideas; Feb. 17, 2000; 2 Pages.
Schneider; "Temperature Calibration of CMOS Magnetic Vector Probe for Contactless Angle Measurement System," IEDM 1996 4 Pages.
Schott et al.; "Linearizing Integrated Hall Devices;" 1997 International Conference on Solid-State Sensors and Actuators, Jun. 16-19, 1997; 4 Pages.
Schott, et al.; "CMOS Single-Chip Electronic Compass with Microcontroller;" IEEE Journal of Solid-State Circuits; vol. 42, No. 12; Dec. 2007; 11 Pages.
Simon et al.; "Autocalibration of Silicon Hall Devices;" 8$^{th}$ International Conference on Solid-State Sensors and Actuators; vol. 2; Jun. 25, 1995; 4 Pages.
Smith et al.; "Low Magnetic Field Sensing with GMR Sensors;" Sensor Magazine; Part 1; Sep. 1999; http://archives.sensorsmag.com/articles/0999/76mail.shtml; 8 Pages.
Smith et al.; "Low Magnetic Field Sensing with GMR Sensors;" Sensor Magazine; Part 2; Oct. 1999; http://archives.sensorsmag.com/articles/1099/84/mail.shtml; 11 Pages.
Steiner et al.; "Double-Hall Sensor with Self-Compensated Offset;" International Electron Devices Meeting; Dec. 7, 1997; ISBN: 0-7803-4100-7; 4 Pages.
Steiner et al; Offset Reduction in Hall Devices by Continuous Spinning Current Method; Sensors and Actuators A66; 1998; 6 Pages.
Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 Pages.

Tian et al.; "Multiple Sensors on Pulsed Eddy-Current Detection for 3-D Subsurface Crack Assessment;" IEEE Sensors Journal, vol. 5, No. 1; Feb. 2005; 7 Pages.
Trontelj et al; "CMOS Integrated Magnetic Field Source Used as a Reference in Magnetic Field Sensors on Common Substrate;" WEP 1-6; IMTC; May 1994; 3 Pages.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; 3 Pages.
Zou et al.; "Three-Dimensional Die Surface Stress Measurements in Delaminated and Non-Delaminated Plastic Packages;" 48th Electronic Components and Technology Conference; May 25, 1998; 12 Pages.
EP Response filed on Dec. 9, 2016 to Official Communication dated Oct. 14, 2016 regarding European Pat. Appl. No. 14742067.3; 20 Pages.
Extended European Search Report dated Apr. 5, 2017 for EP Appl. No. 16192498.0; 10 Pages.
PCT International Preliminary Report on Patentability and Written Opinion of the ISA dated Jan. 28, 2016; For PCT Pat. App. No. PCT/US2014/044236; 17 pages.
PCT Invitation to Pay Additional Fees and Partial Search Report dated Nov. 4, 2014; for PCT Pat. App. No. PCT/US2014/044236; 7 pages.
PCT Search Report and Written Opinion of the ISA dated Dec. 19, 2014; for PCT Pat. App. No. PCT/US2014/044236; 23 pages.
A.A. Thornton response to official communication dated May 22, 2017 and filed on Nov. 17, 2017 regarding Div. EP Patent Application No. 16192498.0; 7 pages.
Amended Claims in response to official communication filed on Nov. 17, 2017 regarding Div. EP Patent Application No. 16192498.0; 7 pages.
U.S. Non-Final Office Action dated Jan. 26, 2018 for U.S. Appl. No. 15/655,135; 49 Pages.
Response to U.S. Non-Final Office Action dated Jan. 26, 2018 for U.S. Appl. No. 15/655,135; Response filed Apr. 3, 2018; 20 Pages.
European Response filed on Nov. 17, 2017 to the Official Communication dated May 22, 2017 for European Application No. 14742067.3; 44 Pages.
Final Office Action dated Jul. 26, 2018 for U.S. Appl. No. 15/655,135; 38 Pages.
Examination Report dated Mar. 5, 2020 for European Application No. 14742067.3; 7 pages.
Response to Final Office Action dated Jul. 26, 2018 for U.S. Appl. No. 15/655,135, filed Oct. 11, 2018; 21 Pages.
DCMD Instruction letter dated Feb. 13, 2019 for KR Pat. Appl. No. 10-2010-7004180; 2 pages.
21st Century Letter dated Mar. 14, 2019 regarding Voluntary Amendment and Substantive Examination for KR Pat. Appl. No. 10-2016-7004180; 1 page.
21st Century Listing of Pending Claims filed on Mar. 14, 2019 regarding Voluntary Amendment and Substantive Examination for KR Pat. Appl. No. 10-2016-7004180; 13 pages.
Response to European Communication filed on May 22, 2020 for European Application No. 14742067.3; 11 pages.
Response to Office Action with English translation filed on Jun. 22, 2020 for Korean Application No. 10-2016-7004180; 44 pages.
Office Action dated Apr. 24, 2020 with English translation for Korean Application No. 10-2016-7004180; 7 pages.

\* cited by examiner

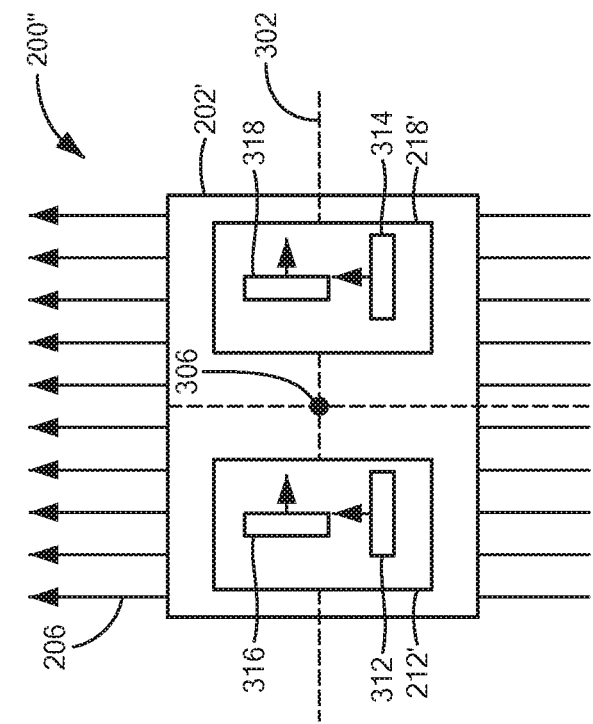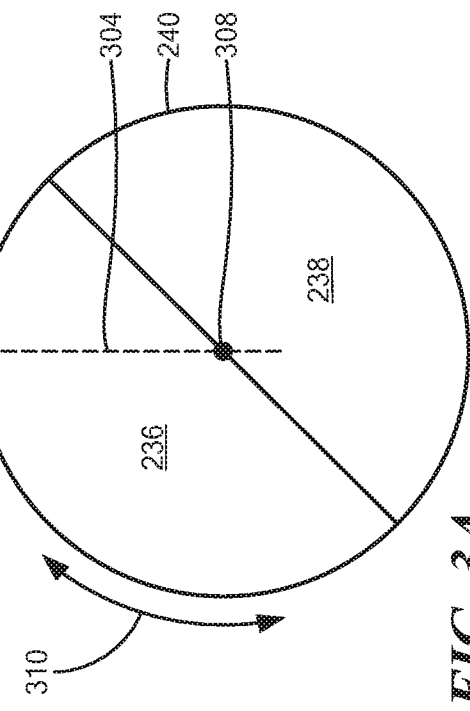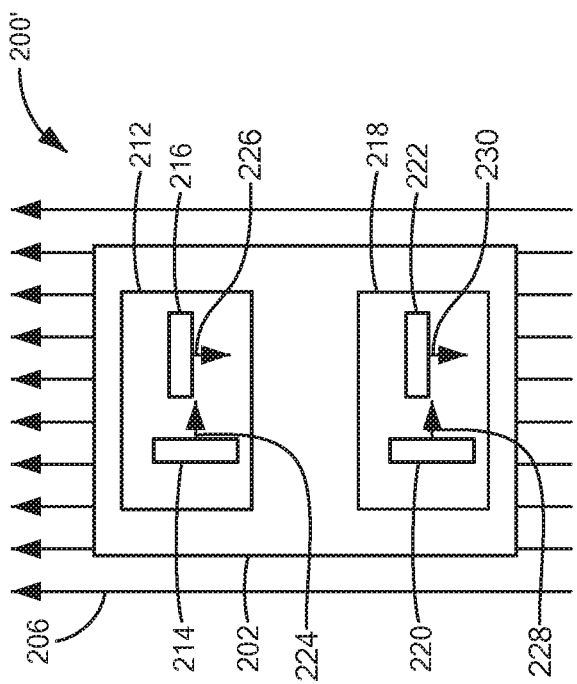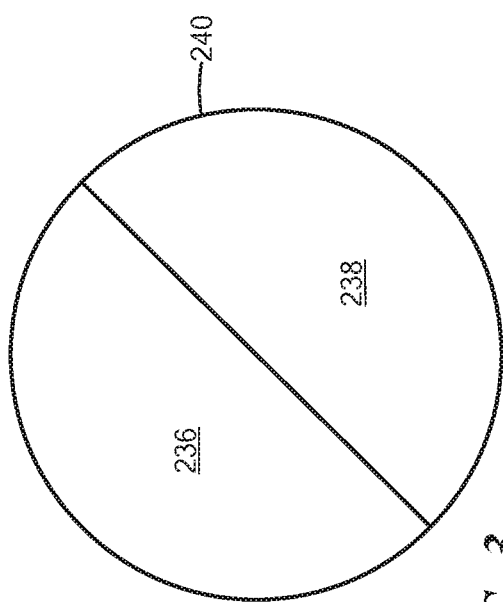
FIG. 3A
FIG. 3

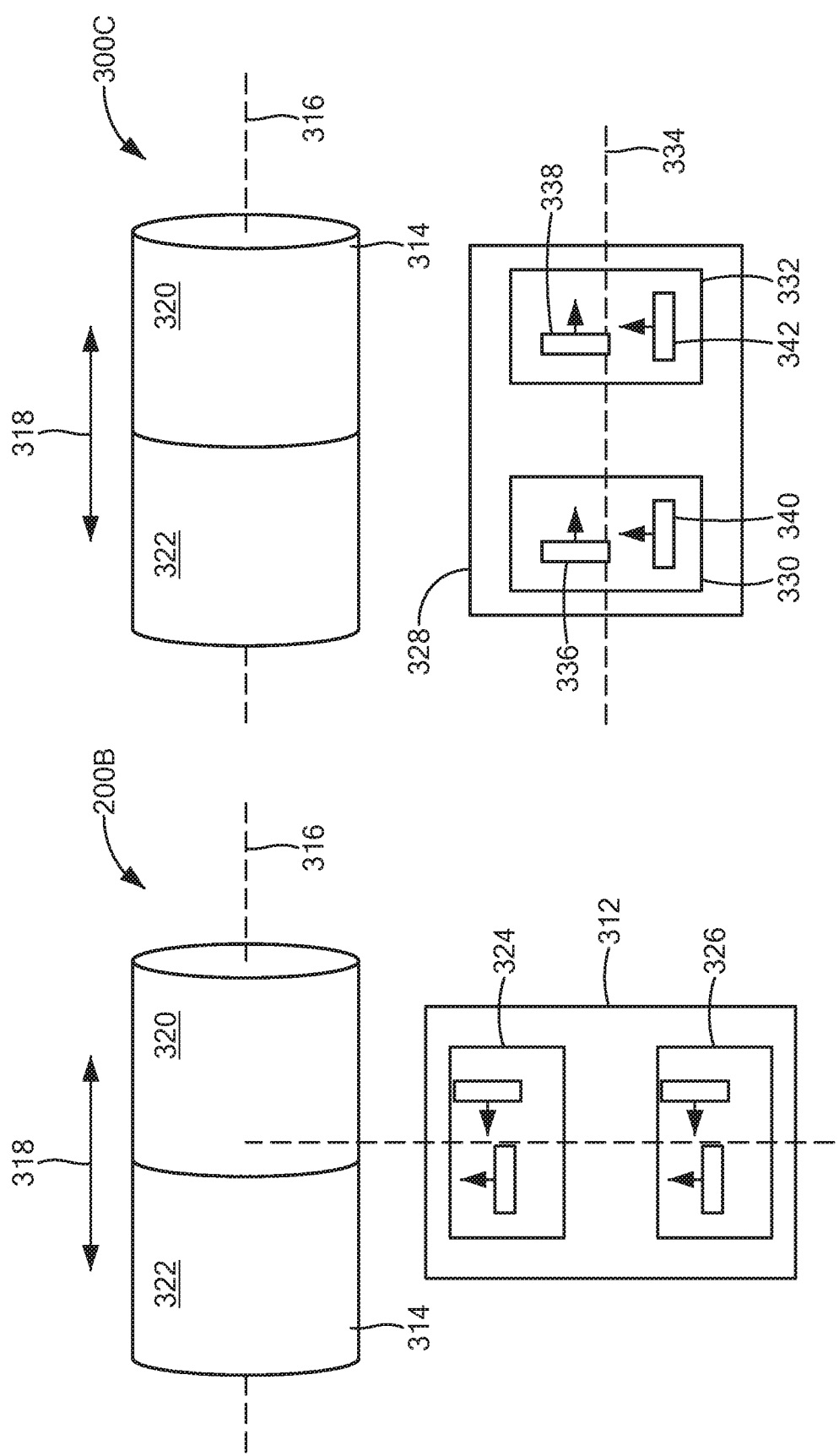

MAGNETIC FIELD INFLUENCE DURING ROTATION MOVEMENT OF MAGNETIC TARGET

FIELD

This disclosure relates to magnetic field sensors and, more particularly, to rejection of stray magnetic fields during detection.

BACKGROUND

Magnetic field sensors are often used to detect a rotating magnetic target. For example, a magnet may be placed at the end of a rotation shaft, such as a cam shaft or axle. A magnetic field sensor can be placed adjacent to the magnet to detect it as the shaft rotates.

In some cases, the magnet and sensor are designed to detect an angular position. The magnet may be positioned so that its polarity vector rotates with the shaft. The sensor may be designed to detect the direction of the polarity vector and calculate a positional angle of the magnet.

Extraneous or stray magnetic fields can make detection of the magnet less accurate and can induce errors in calculating the angle. These fields can be present in the ambient environment or produced by nearby equipment or electronic devices.

SUMMARY

In an embodiment, a system comprises a magnetic target producing a rotating magnetic field, a first set of magnetic field sensing elements placed in spaced relation to the magnetic target and comprising at least a first magnetic field sensing element and a second magnetic field sensing element, each magnetic field sensing element having an axis of maximum sensitivity and a second set of magnetic field sensing elements placed in spaced relation to the magnetic target and comprising at least a third magnetic field sensing element and a fourth magnetic field sensing element, each magnetic field sensing element having an axis of maximum sensitivity. The first set of magnetic field sensing elements is positioned closer to a center point of the magnetic field than the second set of magnetic field sensing elements.

One or more of the following features may be included.

The axes of maximum sensitivity of the magnetic field sensing elements of the first set may define a plane and the axes of maximum sensitivity of the magnetic field sensing elements of the second set may define a plane.

The plane defined by the first set and the plane defined by the second set may be the same plane.

The axis of maximum sensitivity of the first magnetic field sensing element may be orthogonal to the axis of maximum sensitivity of the second magnetic field sensing element and the axis of maximum sensitivity of the third magnetic field sensing element may be orthogonal to the axis of maximum sensitivity of the fourth magnetic field sensing element.

The axis of maximum sensitivity of the first magnetic field sensing element may be parallel to the axis of maximum sensitivity of the third magnetic field sensing element and the axis of maximum sensitivity of the second magnetic field sensing element may be parallel to the axis of maximum sensitivity of the fourth magnetic field sensing element.

The magnetic field sensing elements may be placed so that their respective axes of maximum sensitivity are at a respective predetermined angle with respect to the magnetic field.

The rotating magnetic field may have a direction through the first and second sets of magnetic field sensing elements wherein: the angle of the axis of maximum sensitivity of the first magnetic field sensing element is about 180 degrees with respect to a centerline defined by the first and second sets of magnetic field sensing elements; the angle of the axis of maximum sensitivity of the second magnetic field sensing element is about 90 degrees with respect to the centerline defined by the first and second sets of magnetic field sensing elements; the angle of the axis of maximum sensitivity of the third magnetic field sensing element is about 180 degrees with respect to the centerline defined by the first and second sets of magnetic field sensing elements; and the angle of the axis of maximum sensitivity of the fourth magnetic field sensing element is about 90 degrees with respect to the centerline defined by the first and second sets of magnetic field sensing elements.

The magnetic field sensing elements may be placed so that their respective axes of maximum sensitivity are at a predetermined angle with respect to an expected direction of a stray magnetic field.

The angle of the axis of maximum sensitivity of the first magnetic field sensing element may be about 90 degrees with respect to the expected direction of the stray magnetic field; the angle of the axis of maximum sensitivity of the second magnetic field sensing element may be about 45 degrees with respect to the expected direction of the stray magnetic field; the angle of the axis of maximum sensitivity of the third magnetic field sensing element may be about 90 degrees with respect to the expected direction of the stray magnetic field; and the angle of the axis of maximum sensitivity of the fourth magnetic field sensing element may be about 45 degrees with respect to the expected direction of the stray magnetic field.

The target may comprise a body comprising a cylinder.

A first half of the cylinder may have a first magnetic polarity and a second half of the cylinder may have a second magnetic polarity.

The first and second halves of the cylinder may be defined by a plane through which an axis of the cylinder runs.

The cylinder may be defined by four quadrants, where adjacent quadrants have opposite magnetic polarities.

Each magnetic field sensing element may produce an output signal representing the magnetic field as detected by the respective magnetic field sensing element.

A processing circuit may be coupled to receive the output signals of the magnetic field sensing elements and calculate a detected angle of the magnetic field.

The processing circuit may be configured to cancel the effect of a stray magnetic field having a direction substantially orthogonal to a line from the first set to the second set of magnetic field sensing elements.

The processing circuit may include one or more of: a circuit to perform an arctangent function, a circuit to perform a sin function, and a circuit to perform a cosine function.

In another embodiment, a system comprises: a magnetic target producing a rotating magnetic field; means for detecting the magnetic field and producing one or more signals representing the magnetic field; means for calculating an angle of the rotating magnetic field from the one or more signals; and means for canceling effects of a stray magnetic field from the calculation of the angle.

In another embodiment, a system comprises a magnetic target producing a rotating magnetic field; a first set of magnetic field sensing elements placed in spaced relation to the magnetic target to detect the magnetic field; a second set of magnetic field sensing elements placed in spaced relation to the magnetic target to detect the magnetic field wherein the first set of magnetic field sensing elements is positioned closer to a center point of the magnetic field than the second set of magnetic field sensing elements so that the first set of magnetic field sensing elements detects a stronger magnetic field than the second set of magnetic field sensing elements detects; wherein the first and second set of magnetic field sensing elements are placed so that both sets detect, with approximately equal strength, a stray magnetic field.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

FIG. 3 is a diagram of another embodiment of a magnetic field sensor and a magnetic target.

FIG. 3A is a diagram of another embodiment of a magnetic field sensor and a magnetic target.

FIG. 3B is a diagram of another embodiment of a magnetic field sensor and a magnetic target.

FIG. 3C is a diagram of another embodiment of a magnetic field sensor and a magnetic target.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, and a vertical Hall element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
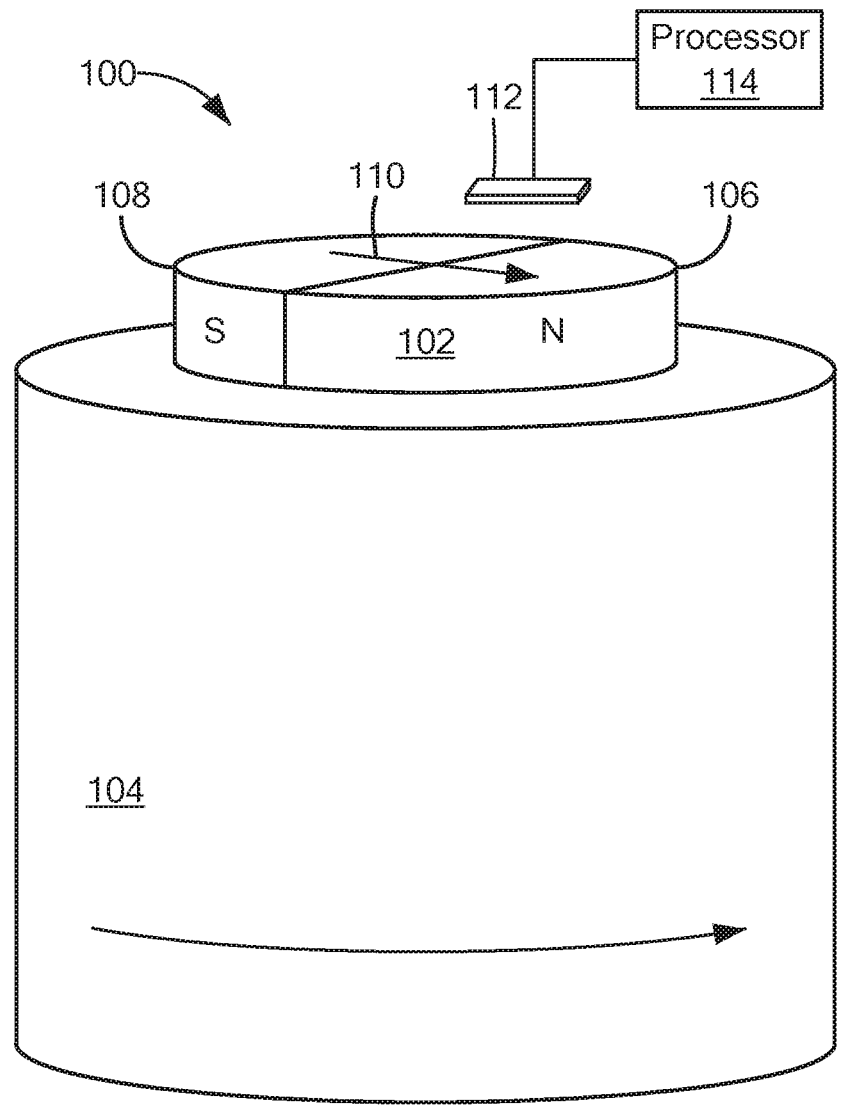
FIG. 1 is a diagram of a system for detecting a rotating target.

FIG. 1 shows an example of a system 100 for detecting a magnetic target 102. Target 102 may be placed at the end of rotating shaft 104. In embodiments, rotating shaft may be a cam shaft, an axle, a spindle, a spool, or any type of machine that rotates.

Magnetic target 102 may be polarized so that it has a north section 106 and a south section 108. In the case of a cylindrical target 102, north section 106 and south section 108 may each comprise a horizontal cylindrical segment of target 102. The polarization of magnet 102 may produce a magnetic field vector in the direction of vector 110.

A magnetic field sensor 112 may be positioned adjacent to target 102 to detect the magnetic field. As shaft 104 rotates, magnetic field vector 110 may also rotate. Magnetic field sensor 112 may be configured to detect the magnetic field and the angle of its rotation.

Magnetic field sensor 112 may be communicatively coupled to a processor 114. As an example, if shaft 104 is a camshaft in a vehicle, processor 114 may be an in-vehicle computer that may control the vehicle based, in part, on information provided by sensor 112. As sensor 112 detects the magnetic field, it may send information about the magnetic field (such as position, speed of rotation, phase, angle, etc.) to processor 114. Magnetic field sensor 112 may also communicate information about any errors encountered to processor 114.

Figure 2:
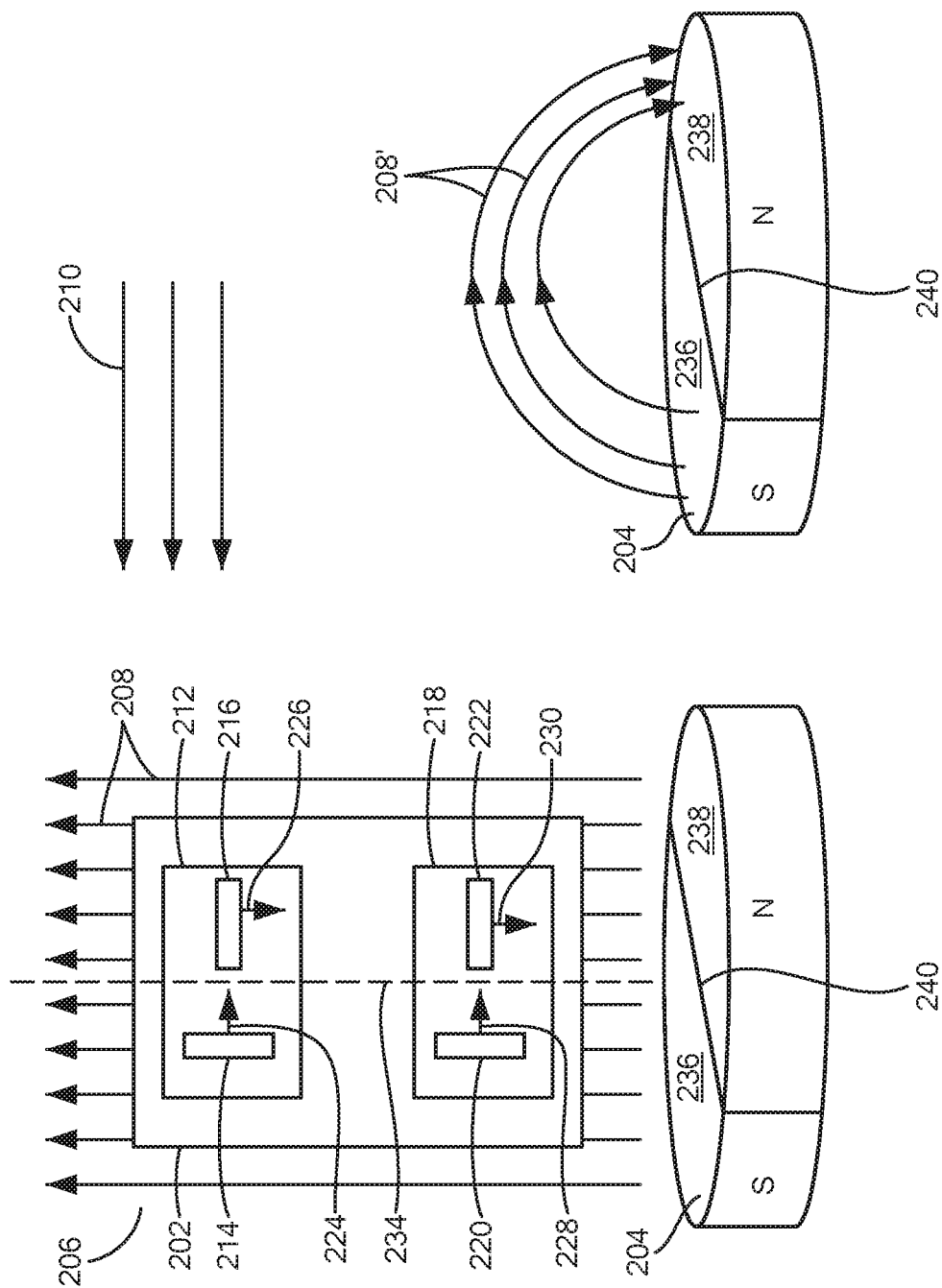
FIG. 2 is a diagram of a magnetic field sensor and a magnetic target.

Referring to FIG. 2, a system 200 includes a magnetic field sensor 202, which may be the same as or similar to magnetic field sensor 112, and a target 204, which may be the same as or similar to target 102. Target 204 may produce magnetic field 206. For ease of illustration, magnetic field 206 produced by target 204 is illustrated by straight magnetic field lines 208. However, the direction of magnetic field 206 may be different from that shown by magnetic field lines 208. For example, magnetic field lines 208' may present a more realistic depiction of a magnetic field produced by target 204. One skilled in the art will recognize that, throughout the figures, magnetic fields may be drawn with straight lines for ease of illustration, but may take other shapes, forms, and directions depending on the type and shape of the magnetic source. Even though a magnetic field is drawn in the figures using straight lines, it does not necessarily indicate that the magnetic field has uniform field strength along those lines, unless specifically described as uniform in the text. For example, the magnetic field depicted by magnetic field lines 208 will have greater strength (e.g. flux density) around pair 218 (closer to target 204) and relatively weaker strength around pair 212 (further away from target 204).

Magnetic field sensor 202 may be positioned adjacent to target 204 to detect magnetic field 206 as target 204 rotates and compute an angle of rotation of target 204. Magnetic field lines 210 represent an external, or stray, magnetic field that can influence detection of magnetic field 206 by sensor 202 and potentially cause errors or inaccuracies.

In embodiments, magnetic field sensor 202 may include a first set 212 of magnetic field sensing elements 214 and 216, and a second set 218 of magnetic field sensing elements 220 and 222. Each set may contain a pair of magnetic field sensing elements. In other embodiments, each set may contain more than two magnetic field sensing elements.

Magnetic field sensing element 202 may be positioned so that set 218 is closer to target 204 than set 212. Thus, magnetic field sensing elements 220 and 222 may be subject to and detect a stronger magnetic field 206 than that which is detected by magnetic field sensing elements 214 and 216.

Magnetic field 210 may be a uniform magnetic field that affects magnetic field sensing elements 220, 222, 214, and 216 substantially equally. Thus, in contrast to magnetic field 208, magnetic fields sensing elements 220, 222, 216, and 216 may be subject to and detect a substantially equal stray magnetic field 210.

Each magnetic field sensing element 214, 216, 220, and 222 has an axis of maximum sensitivity (as described above) represented by arrows 224, 226, 228, and 230, respectively. The axes of maximum sensitivity 224 and 226 may be viewed as non-parallel vectors and thus may define a first plane. Similarly, the axes of maximum sensitivity 228 and 23o may be viewed as non-parallel vectors and thus may define a second plane. In embodiments, the first and second planes may be the same (or substantially the same) plane as shown in FIG. Magnetic field sensing elements 214, 216, 228, and 230 may be placed within the plane formed by the axes of maximum sensitivities, with set 212 of magnetic field sensing elements 214 and 216 being further away from target 204 than set 218 of magnetic field sensing elements 220 and 222.

In embodiments, axis of maximum sensitivity 224 of magnetic field sensing element 214 is orthogonal to axis of maximum sensitivity 226 of magnetic field sensing element 216, and the axis of maximum sensitivity 228 of magnetic field sensing element 220 is orthogonal to the axis of maximum sensitivity 230 of magnetic field sensing element 222.

As shown in FIG. 2, axes of maximum sensitivity 224 and 226 form a ninety-degree angle with each other. In an embodiment, magnetic field sensing elements 214 and 216 may also be placed so that their respective axes of maximum sensitivity form a forty-five degree angle with respect to magnetic field 206. Similarly, axes of maximum sensitivity 228 and 230 form a ninety-degree angle with each other. In an embodiment, magnetic field sensing elements 220 and 222 may also be placed so that their respective axes of maximum sensitivity form a forty-five-degree angle with respect to magnetic field 206.

One skilled in the art will recognize that the respective angle formed by the axes of maximum sensitivity 224, 226, 228, and 230 may be described with various coordinate systems. For example, using an angular coordinate system 232 and assuming centerline 234 is parallel to the expected direction of magnetic field 206, the angle between axis of maximum sensitivity 226 and centerline 234 is about 180 degrees; the angle between axis of maximum sensitivity 224 and centerline 234 is about 90 degrees; the angle between the axis of maximum sensitivity 230 and centerline 234 is about 180 degrees; and the angle between axis of maximum sensitivity 228 and centerline 234 is about 90 degrees with respect to centerline 234.

As noted above, stray magnetic field 210 may have an expected direction that is orthogonal to magnetic field 206. Thus, in one example, the magnetic field sensing elements may be placed so that the angle between axis of maximum sensitivity 226 and stray magnetic field 210 may be 90 degrees; the angle between axis of maximum sensitivity 224 and stray magnetic field 210 may be 45 degrees; the angle between axis of maximum sensitivity 230 and stray magnetic field 210 may be 90 degrees; and the angle between axis of maximum sensitivity 228 and stray magnetic field 210 may be 45 degrees.

Target 204 may be a cylindrical, rotating target. In some instances, target 204 may be an end-of-shaft magnetic target that may be placed on the end of a rotating shaft. Target 204 may comprise two horizontal cylindrical segments 236 and 238 formed by a plane (represented by line 240) that runs parallel to and through the cylinders axis of symmetry. Segments 236 and 238 may have opposite magnetic polarity—magnetic south for segment 236 and magnetic north for segment 238, for example.

As target 204 rotates, so does magnetic field 206. Each magnetic field sensing element 214, 216, 220, and 222 may detect magnetic field 206 and produce an output signal representing magnetic field 206 as detected by the respective magnetic field sensing element.

The positioning of the pairs 212 and 218 may allow magnetic field sensor 202 to detect magnetic field 206 while reducing interference or errors from stray field 210. For example, because set 212 is further from target 204 than is set 218, set 212 may detect a weaker magnetic field 206 than that detected by set 218.

Figure 2A:
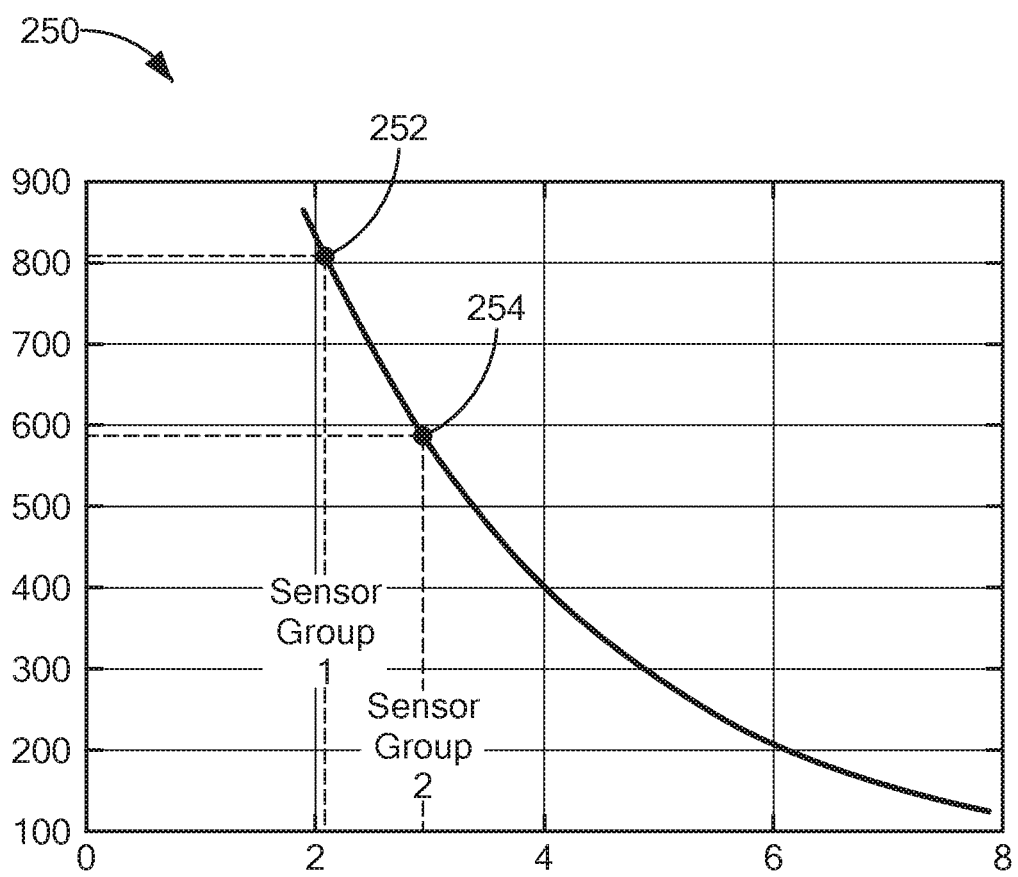
FIG. 2A is a graph of magnetic field strength versus distance.

Referring to FIG. 2A, graph 250 illustrates the difference in magnetic field strength experienced by the pairs of magnetic field sensing elements. In graph 250, the horizontal axis represents distance between the magnetic field sensing element and the target, and the vertical axis represents the magnetic field as detected by a magnetic field sensing element. If set 218 is placed at a distance of about 2 mm from the target, it may experience 800 Gauss of field strength, according to point 252. If set 212 is placed at a distance of about 3 mm from the target, it may experience 600 Gauss of field strength, according to point 254.

The field strength difference may also be detected by magnetic field sensing elements placed in two 3D sensing groups. These groups may be in the same die, or on different die, so long as their respective spacing from the target is maintained. If they are placed on the same die, the die may be positioned perpendicular to the target so that one group (or set) of magnetic field sensing elements is further from the target than the other.

Referring again to FIG. 2, in embodiments, magnetic field 210 may be a substantially uniform magnetic field. Thus, set 212 and set 218 may detect magnetic field 210 with the same magnitude or strength. A processor (such as processor 114 in FIG. 1) may receive the outputs from each set 212 and 218 and use the varying magnetic field strengths detected by pairs 212 and 218 to calculate an angle of magnetic field 206 while reducing or minimizing the effect that magnetic field 210 has on the calculation.

Referring to FIG. 3, in an embodiment, system 200' may include magnetic field sensor 202 and target 240 arranged so that magnetic field sensor 202 is orthogonal to the cylindrical (e.g. center) axis of target 240. In this embodiment, the cylindrical axis of target 240 may perpendicular (into and out of) the page. Magnetic field sensor 202 may be arranged so that set 218 is closer to target 240 (i.e. closer to the central axis) than is set 212. In this embodiment, the stray field may have an expected direction orthogonal to magnetic field 206 (i.e. an expected direction into or out of the page). In other embodiments, the stray field may have an expected direction along the plane of the page, similar to that of stray magnetic field 210 shown in FIG. 2.

In this arrangement, magnetic field sensing element 212 may be positioned further away that magnetic field sensing element pair 218 from target 240. In an embodiment, magnetic field sensing element pair 212, magnetic field sensing element pair 218, and target 240 may be arranged in a line. The strength of magnetic field 206 may be greater closer to target 240 and relatively weaker further away from target 240. As a result, magnetic field sensing element pair 218 may detect a stronger magnetic field than magnetic field sensing element pair 212.

Referring to FIG. 3A, system 200" may include magnetic field sensor 202' having magnetic field sensing element pair 212' and magnetic field sensing element pair 218'. Magnetic field sensor 202' may be positioned so that a line 302 drawn through the center of pair 212' and pair 218' is substantially perpendicular to a line 304 drawn through the center 306 of magnetic field sensor 202' and the center 308 of target 240.

In embodiments, target 240 may rotate about an axis of rotation that passes through center point 308 and goes into and out of the page. In other words, target 240 may rotate in a clockwise and/or counterclockwise direction, as shown by arrow 310, about center point 308.

As target 240 rotates, the magnetic field 206 it produces also rotates about the axis of rotation. As magnetic field 206 rotates past magnetic field sensing element pairs 212' and 218', the magnetic field sensing elements will detect changes in the magnetic field due to its rotation. Assume that magnetic field 206 is rotating in a counterclockwise direction. Magnetic field sensing element pair 218' may detect a particular level or a particular change in magnetic field 206 before magnetic field sensing element pair 212' does. Thus, an output signal from magnetic field sensing element pair 218' may reflect the particular change or level before an output signal from magnetic field sensing element pair 212' does. In other words, in this arrangement, there may be a phase difference between the output signals of the magnetic field sensing elements of pair 218' and the magnetic field sensing elements of pair 212'. This phase difference may be used to detect speed of rotation, direction of rotation, position of target 240, etc.

Referring to FIG. 3B, in an embodiment, system 300B may include magnetic field sensor 312 and target 314. Target 314 may be a cylindrical or flat rod-shaped target configured to move back and/or forth along line 316 as shown by arrow 318. Target 314 may include a magnetic north segment 320 directly adjacent to a magnetic south segment 322. Although two segments 320, 322 are shown, target 314 may include additional segments coupled together so that adjacent segments have opposite magnetic poles. In embodiments, target 314 may have one or more non-magnetic segments adjacent to magnetic segments. The magnetic segments surrounding a non-magnetic segment may have opposite magnetic poles or the same magnetic poles.

Magnetic field sensor 312 may include a first pair 324 of magnetic field sensing elements and a second pair 326 of magnetic field sensing elements. Magnetic field sensor 312 may arranged so that a line drawn from the center of pair 326 to the center of pair 324 is substantially perpendicular to the line of travel 316 of target 314. Pair 324 may be closer than pair 326 to target 314. As a result, the magnetic field sensing elements of pair 324 may detect a stronger magnetic field than the magnetic field sensing elements of pair 326.

Referring to FIG. 3C, in an embodiment, system 300C may include magnetic field sensor 328 and target 314. Target 314 may be a cylindrical or flat rod-shaped target configured to move back and/or forth along line 316 as shown by arrow 318. Target 314 may include a magnetic north segment 320 directly adjacent to a magnetic south segment 322. Although two segments 320, 322 are shown, target 314 may include additional segments coupled together so that adjacent segments have opposite magnetic poles. In embodiments, target 314 may have one or more non-magnetic segments adjacent to magnetic segments. The magnetic segments surrounding a non-magnetic segment may have opposite magnetic poles or the same magnetic poles.

Magnetic field sensor 328 may include a first pair 330 of magnetic field sensing elements and a second pair 332 of magnetic field sensing elements. Magnetic field sensor 328 may arranged so that a line 334 drawn from the center of pair 330 to the center of pair 332 is substantially parallel to the line of travel 316 of target 314.

In embodiments, target 314 may move translationally in the directions indicated by arrow 318. As target 314 moves, the magnetic field it produces also moves. As the magnetic field moves past or through magnetic field sensing element pairs 330 and 332, the magnetic field sensing elements will detect changes in the magnetic field due to its movement. Assume that target 314 is moving in a left-to-right direction on the page. Magnetic field sensing element pair 330 may detect a particular level or a particular change in the magnetic field before magnetic field sensing element pair 332 does. Thus, an output signal from magnetic field sensing element pair 330 may reflect the particular change or level before an output signal from magnetic field sensing element pair 332 does. In other words, in this arrangement, there may be a phase difference between the output signals of the magnetic field sensing elements of pair 330 and the magnetic field sensing elements of pair 332. This phase difference may be used to detect speed of rotation, direction of rotation, position of target 314, etc.

Figure 4:
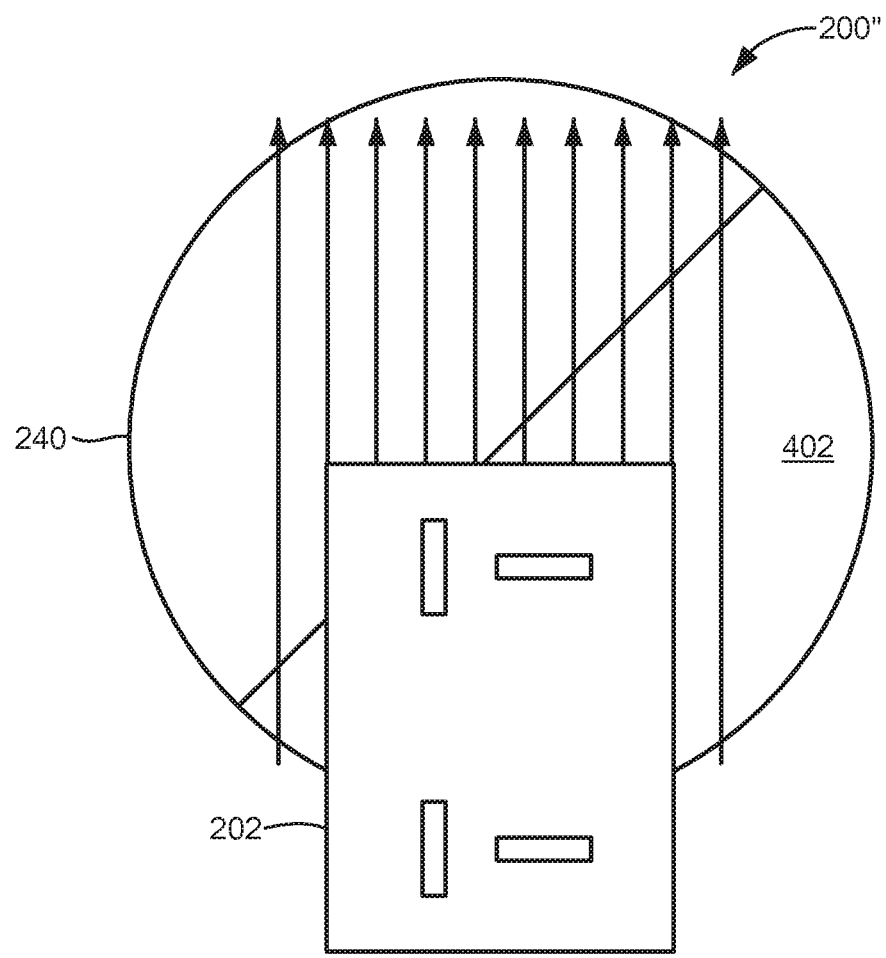
FIG. 4 is a diagram of another embodiment of a magnetic field sensor and a magnetic target.

Referring to FIG. 4, in an embodiment, system 200''' may include magnetic field sensor 202 and target 240 arranged so that magnetic field sensor 202 overlaps a flat surface 402 of target 202. In other embodiments, magnetic field sensor may be offset from the center of target 240.

Figure 5:
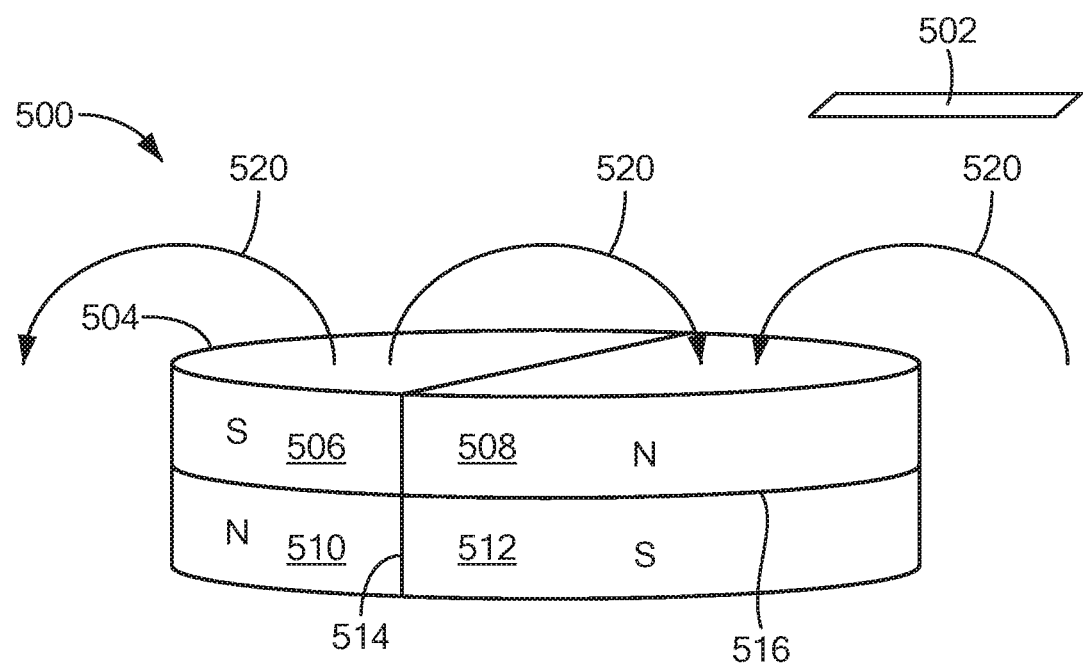
FIG. 5 is a diagram of a magnetic target with a magnetic field sensor.

Referring to FIG. 5, system 500 may include a magnetic field sensor 502, which may be the same as or similar to magnetic field sensor 202. Magnetic field sensor 502 may be placed adjacent to target 504 to detect a magnetic field produced by target 504.

Target 504 may comprise four quadrants 506-512. Each adjacent quadrant may have opposite magnetic polarities. For example, quadrant 506 and 508 may be adjacent because they share an edge 514. Thus, quadrant 506 may have a south polarity and quadrant 508 may have a north polarity. Quadrant 508 and 512 may be adjacent because they share an edge 516. Thus, quadrant 512 may have a south polarity and quadrant 508 may have a north polarity. Quadrant 510 may have a north polarity and share edges with south polarity quadrants 506 and 512.

The four quadrants 506-512 may produce a magnetic field with a direction, in part, that is substantially parallel to the top surface of target 504 as shown, for example, by magnetic field lines 520. Magnetic field sensor 502 may be offset from the center of target 504 to detect the magnetic field produced by target 504 as target 504 rotates. In another embodiment, magnetic field sensor 502 may be positioned adjacent to the circumference of target 504.

Figure 6:
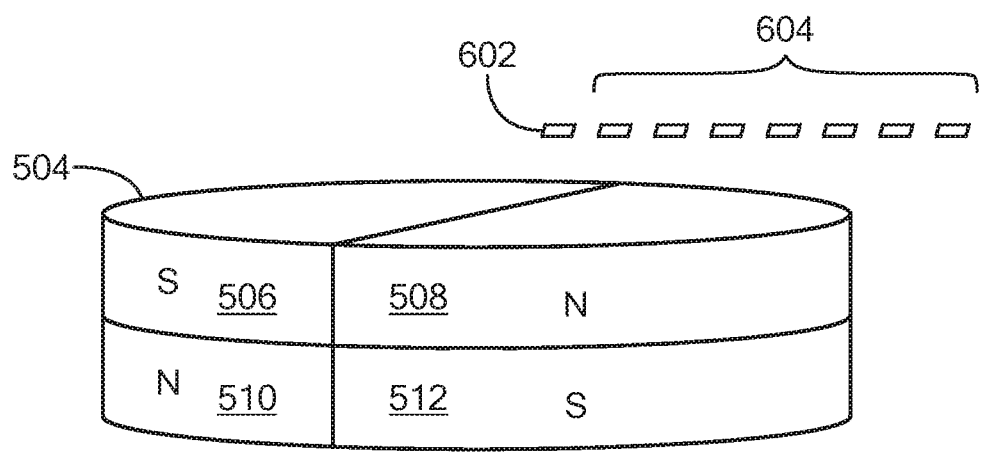
FIG. 6 is a diagram of a magnetic target with positioning of a magnetic field sensor.

Referring to FIG. 6, the magnetic field sensor may be centered in position 602 over target 504, or may be offset, as shown by positions 604. As noted above, the magnetic field sensor may have two (or more) pairs or sets of magnetic field sensing elements. (See set 212 and set 218 in FIG. 2). In embodiments, one set of magnetic field sensing elements may be positioned closer to the center of target 504 at, for example, position 602. The other set of magnetic field sensing elements may be further offset from the center of target 504 at, for example, one of the positions 604. Separation of the sets of magnetic field sensing elements may result in one set detecting a stronger magnetic field from target 504 and the other set detecting a weaker magnetic field from target 504. The difference in detected field strength may be utilized to reject stray magnetic fields, as described above.

Figure 7:
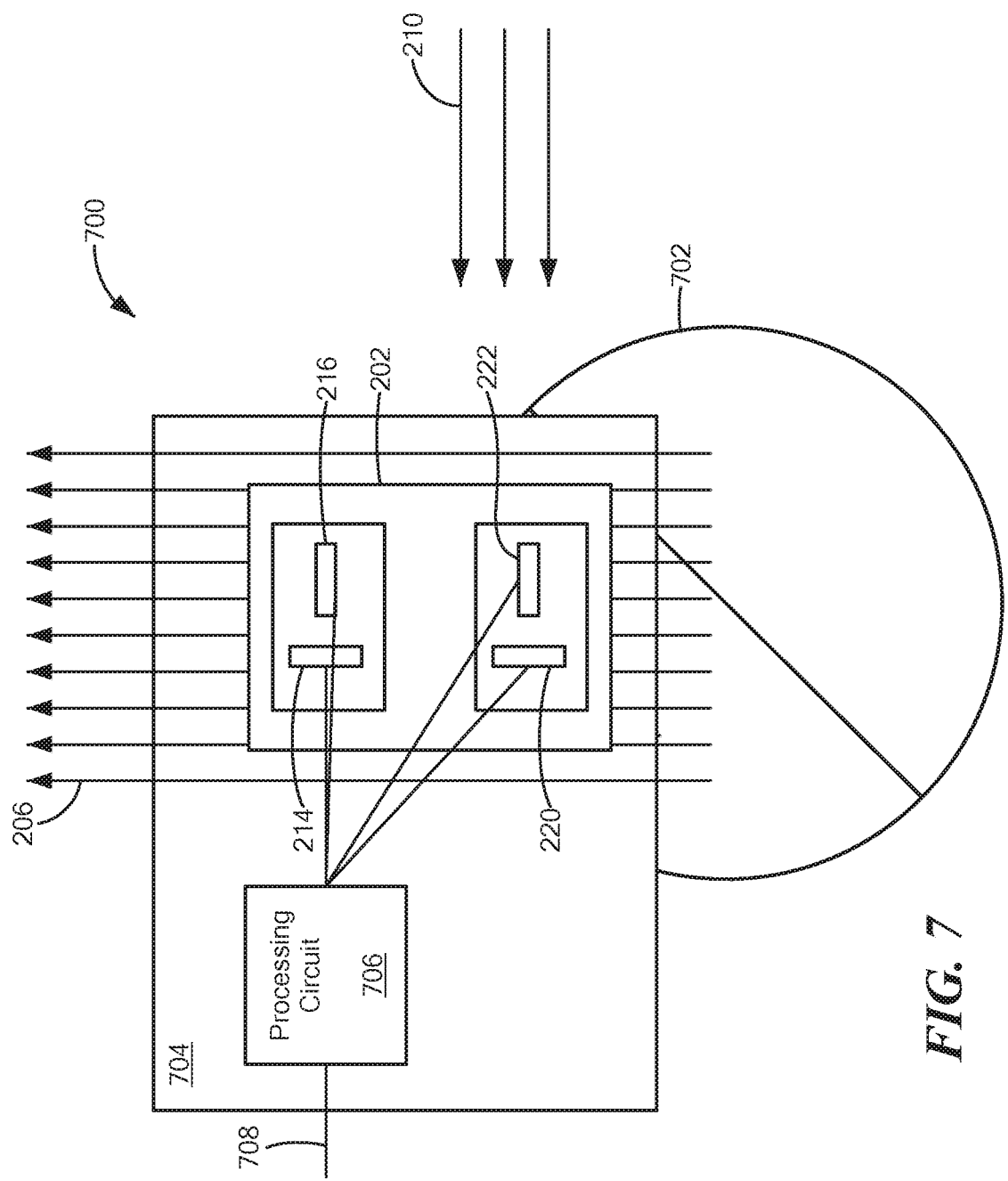
FIG. 7 is a diagram of a magnetic field sensor showing a processing circuit, and a magnetic target.

Referring to FIG. 7, system 700 may include magnetic field sensor 202 and target 702. Target 702 may be the same as or similar to target 204 or 504. System 700 may also include a substrate 704, which may be a semiconductor substrate, and which may support processing circuit 706 (e.g. processing circuit 706 may be formed in and/or on substrate 704). Substrate 704 may also support magnetic field sensor 202 and magnetic field sensing elements 214, 216, 220, 222.

Processing circuit 706 may include circuitry to receive signals from magnetic field sensing elements 214, 216, 220, 222, which represent detection of magnetic field 206, and may calculate an angle of rotation of magnetic field 206, a speed of rotation of magnetic field 206, etc. To perform the calculation, processing circuit 706 may include custom circuitry and/or processor executing software or firmware code that calculates the angle of the magnetic field. Processing circuit 706 may also generate an output signal 708 representing the computed angle, speed, etc.

Immunity to stray field 210 may be accomplished by utilizing the varying levels of signal intensity from the magnetic field sensing elements. As noted above, magnetic field sensing elements 220 and 222 may detect a stronger magnetic field 206 than magnetic field sensing elements 214 and 216 detect, because magnetic field sensing elements 220 and 222 may be closer to target 702.

Processor 706 may use the following equations to compute the detected magnetic field:

$$H1y = AB_1 \sin \theta_B + AB_{stray} \sin \theta_{stray} \tag{1}$$

$$H1x = AB_1 \cos \theta_B + AB_{stray} \cos \theta_{stray} \tag{2}$$

$$H2y = AkB_1 \sin \theta_B + AB_{stray} \sin \theta_{stray} \tag{3}$$

$$H2x = AkB_1 \cos \theta_B + AB_{stray} \cos \theta_{stray} \tag{4}$$

In the equations above, H1y is the output signal of magnetic field sensing element 216, H1x is the output signal of magnetic field sensing element 214, H2y is the output of magnetic field sensing element 222, H2x is the output of magnetic field sensing element 222, A is a scalar sensitivity factor of the magnetic field sensing elements, $B_1$ is magnetic field 206, $B_{stray}$ is stray magnetic field 210, and k is a scaling factor representing the difference in magnetic field strength as detected by set 212 and set 218 (see FIG. 2).

Subtracting equations 4 from 1 and 3 from 2 removes the effect of the stray field and reduces the equations to the following:

$$Hy\text{diff} = (1-k)AB_1 \sin \theta_B \tag{5}$$

$$Hx\text{diff} = (1-k)AB_1 \cos \theta_B \tag{6}$$

The angle of rotation of the magnetic field can be calculated with the following formula:

$$\theta_B = \arctan\left(\frac{Hy\text{diff}}{Hx\text{diff}}\right) \tag{7}$$

Processing circuit 706 may provide the signal $\theta_B$ as output signal 708.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited in this disclosure are incorporated here by reference in their entirety.

The invention claimed is:

1. A system comprising:
a magnetic target producing a rotating magnetic field;
a first set of magnetic field sensing elements placed in spaced relation to the magnetic target and comprising at least a first magnetic field sensing element and a second magnetic field sensing element, each magnetic field sensing element having an axis of maximum sensitivity;
a second set of magnetic field sensing elements placed in spaced relation to the magnetic target and comprising at least a third magnetic field sensing element and a fourth magnetic field sensing element, each magnetic field sensing element having an axis of maximum sensitivity; and
wherein the first set of magnetic field sensing elements is positioned closer to the magnetic target than the second set of magnetic field sensing elements,
wherein the axes of maximum sensitivity of the magnetic field sensing elements of the first set define a first plane and the axes of maximum sensitivity of the magnetic field sensing elements of the second set define a second plane,
wherein the axis of maximum sensitivity of the first magnetic field sensing element is orthogonal to the axis of maximum sensitivity of the second magnetic field sensing element; and wherein the axis of maximum sensitivity of the third magnetic field sensing element is orthogonal to the axis of maximum sensitivity of the fourth magnetic field sensing element;

wherein the axis of maximum sensitivity of the first magnetic field sensing element is parallel to the axis of maximum sensitivity of the third magnetic field sensing element;

wherein the axis of maximum sensitivity of the second magnetic field sensing element is parallel to the axis of maximum sensitivity of the fourth magnetic field sensing element, wherein the first and second magnetic field sensing elements are on opposite sides of a centerline, the centerline being parallel to the magnetic field; and wherein the third and fourth magnetic field sensing elements are on opposite sides of the centerline, wherein the centerline is parallel to the first plane.

2. The system of claim 1 wherein the first plane and the second plane are the same plane.

3. The system of claim 1 wherein magnetic field sensing elements are placed so that their respective axes of maximum sensitivity are at a respective predetermined angle with respect to the magnetic field.

4. The system of claim 1 wherein the magnetic field sensing elements are placed so that their respective axes of maximum sensitivity are at a predetermined angle with respect to an expected direction of a stray magnetic field.

5. The system of claim 1 wherein the target comprises a body comprising a cylinder.

6. The system of claim 5 wherein a first half of the cylinder has a first magnetic polarity and a second half of the cylinder has a second magnetic polarity.

7. The system of claim 6 wherein the first and second halves of the cylinder are defined by a plane through which an axis of the cylinder runs.

8. The system of claim 5 wherein the cylinder is defined by four quadrants, where adjacent quadrants have opposite magnetic polarities.

9. The system of claim 1 wherein the target comprises a rod.

10. The system of claim 9 wherein the rod comprises two or more segments having different magnetic polarity.

11. The system of claim 1 wherein each magnetic field sensing element produces an output signal representing the magnetic field as detected by the respective magnetic field sensing element.

12. The system of claim 11 further comprising a processing circuit coupled to receive the output signals of the magnetic field sensing elements and calculate a detected angle of the magnetic field.

13. The system of claim 12 wherein the processing circuit is configured to cancel the effect of a stray magnetic field having a direction substantially orthogonal to a line from the first set to the second set of magnetic field sensing elements.

14. The system of claim 12 wherein the processing circuit includes one or more of: a circuit to perform an arctangent function, a circuit to perform a sin function, and a circuit to perform a cosine function.

15. A system comprising:
a magnetic target producing a rotating magnetic field;
a first set of magnetic field sensing elements placed in spaced relation to the magnetic target and comprising at least a first magnetic field sensing element and a second magnetic field sensing element, each magnetic field sensing element having an axis of maximum sensitivity; and a second set of magnetic field sensing elements placed in spaced relation to the magnetic target and comprising at least a third magnetic field sensing element and a fourth magnetic field sensing element, each magnetic field sensing element having an axis of maximum sensitivity;

wherein the first set of magnetic field sensing elements is positioned closer to the magnetic target than the second set of magnetic field sensing elements, wherein magnetic field sensing elements are placed so that their respective axes of maximum sensitivity are at a respective predetermined angle with respect to the magnetic field, wherein the angle of the axis of maximum sensitivity of the first magnetic field sensing element is about 180 degrees with respect to a centerline defined by the first and second sets of magnetic field sensing elements;

wherein the angle of the axis of maximum sensitivity of the second magnetic field sensing element is about 90 degrees with respect to the centerline defined by the first and second sets of magnetic field sensing elements;

wherein the angle of the axis of maximum sensitivity of the third magnetic field sensing element is about 180 degrees with respect to the centerline defined by the first and second sets of magnetic field sensing elements; and wherein the angle of the axis of maximum sensitivity of the fourth magnetic field sensing element is about 90 degrees with respect to the centerline defined by the first and second sets of magnetic field sensing elements.

16. The system of claim 7 wherein:
the axis of maximum sensitivity of the first magnetic field sensing element is orthogonal to the axis of maximum sensitivity of the second magnetic field sensing element; and
the axis of maximum sensitivity of the third magnetic field sensing element is orthogonal to the axis of maximum sensitivity of the fourth magnetic field sensing element.

17. The system of claim 16 wherein:
the axis of maximum sensitivity of the first magnetic field sensing element is parallel to the axis of maximum sensitivity of the third magnetic field sensing element; and
the axis of maximum sensitivity of the second magnetic field sensing element is parallel to the axis of maximum sensitivity of the fourth magnetic field sensing element.

18. The system of claim 15 wherein the axes of maximum sensitivity of the magnetic field sensing elements of the first set define a first plane and the axes of maximum sensitivity of the magnetic field sensing elements of the second set define a second plane.

19. The system of claim 18 wherein the first plane and the second plane are the same plane.

20. The system of claim 15 wherein the magnetic field sensing elements are placed so that their respective axes of maximum sensitivity are at a respective predetermined angle with respect to the magnetic field.

21. The system of claim 15 wherein the magnetic field sensing elements are placed so that their respective axes of maximum sensitivity are at a predetermined angle with respect to an expected direction of a stray magnetic field.

22. A system comprising:
a magnetic target producing a rotating magnetic field;
a first set of magnetic field sensing elements placed in spaced relation to the magnetic target and comprising at least a first magnetic field sensing element and a second magnetic field sensing element, each magnetic field sensing element having an axis of maximum sensitivity;

a second set of magnetic field sensing elements placed in spaced relation to the magnetic target and comprising at least a third magnetic field sensing element and a fourth magnetic field sensing element, each magnetic field sensing element having an axis of maximum sensitivity; and wherein the first set of magnetic field sensing elements is positioned closer to the magnetic target than the second set of magnetic field sensing elements, wherein the magnetic field sensing elements are placed so that their respective axes of maximum sensitivity are at a predetermined angle with respect to an expected direction of a stray magnetic field, wherein the angle of the axis of maximum sensitivity of the first magnetic field sensing element is positioned at a 90° angle with respect to the expected direction of the stray magnetic field, wherein the angle of the axis of maximum sensitivity of the second magnetic field sensing element is positioned at a 45° angle to the expected direction of the stray magnetic field, wherein the angle of the axis of maximum sensitivity of the third magnetic field sensing element is positioned at a 90° angle with respect to the expected direction of the stray magnetic field, and wherein the angle of the axis of maximum sensitivity of the fourth magnetic field sensing element is positioned at a 45° angle to the expected direction of the stray magnetic field.

* * * * *

UNITED STATES PATENT AND TRADEMARK OFFICE
CERTIFICATE OF CORRECTION

PATENT NO. : 10,866,117 B2
APPLICATION NO. : 15/909208
DATED : December 15, 2020
INVENTOR(S) : Nevenka Kozomora et al.

It is certified that error appears in the above-identified patent and that said Letters Patent is hereby corrected as shown below:

In the Specification

Column 2, Line 59, delete "sin" and replace with --sine--.

Column 3, Line 6, delete "field" and replace with --field,--.

Column 3, Line 63, delete "element (AMR)" and replace with --(AMR) element--.

Column 4, Lines 5-6, delete "Gallium-Arsenide" and replace with --Gallium Arsenide--.

Column 4, Lines 6-7, delete "Indium-Antimonide" and replace with --Indium Antimonide--.

Column 4, Line 39, delete "shaft may" and replace with --shaft 104 may--.

Column 5, Line 15, delete "e.g." and replace with --e.g.,--.

Column 5, Line 31, delete "Magnetic field sensing element 202" and replace with --Magnetic field sensor 202--.

Column 5, Line 39, delete "fields" and replace with --field--.

Column 5, Line 39, delete "216" and replace with --214--.

Column 5, Line 48, delete "23o" and replace with --230--.

Column 5, Line 51, delete "in FIG." and replace with --in FIG. 2--.

Column 5, Line 52, delete "228, and 230" and replace with --220, and 222--.

Column 6, Line 37, delete "cylinders" and replace with --cylinder's--.

Signed and Sealed this
Sixteenth Day of November, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,866,117 B2

Column 7, Line 16, delete "e.g." and replace with --e.g.,--.

Column 7, Line 17, delete "may perpendicular (into" and replace with --may be perpendicular to (into--.

Column 7, Line 19, delete "i.e." and replace with --i.e.,--.

Column 7, Line 22, delete "i.e." and replace with --i.e.,--.

Column 7, Line 26, delete "element 212" and replace with --element pair 212--.

Column 7, Line 27, delete "that" and replace with --than--.

Column 7, Line 66, delete "300B" and replace with --200B--.

Column 8, Line 16, delete "may arranged" and replace with --may be arranged--.

Column 8, Line 39, delete "may arranged" and replace with --may be arranged--.

Column 8, Line 64, delete "target 202" and replace with --target 240--.

Column 8, Line 64, delete "sensor may" and replace with --sensor 202 may--.

Column 9, Line 25, delete "FIG. 2)." and replace with --FIG. 2)--.

Column 9, Line 42, delete "e.g." and replace with --e.g.,--.

Column 10, Line 7, delete "output of" and replace with --output signal of--.

Column 10, Line 8, delete "222" and replace with --230--.

Column 10, Line 8, delete "output of" and replace with --output signal of--.

In the Claims

Column 11, Line 58, delete "sin" and replace with --sine--.